United States Patent
Peake

(10) Patent No.: US 7,682,889 B2
(45) Date of Patent: Mar. 23, 2010

(54) TRENCH FIELD EFFECT TRANSISTOR AND METHOD OF MAKING IT

(75) Inventor: Steven T. Peake, Warrington (GB)

(73) Assignee: NXP B.V., Eindhoven (NL)

( * ) Notice: Subject to any disclaimer, the term of this patent is extended or adjusted under 35 U.S.C. 154(b) by 502 days.

(21) Appl. No.: 10/591,194

(22) PCT Filed: Feb. 23, 2005

(86) PCT No.: PCT/IB2005/050653
§ 371 (c)(1), (2), (4) Date: Aug. 30, 2006

(87) PCT Pub. No.: WO2005/088695
PCT Pub. Date: Sep. 22, 2005

(65) Prior Publication Data
US 2007/0141783 A1    Jun. 21, 2007

(30) Foreign Application Priority Data
Mar. 3, 2004 (GB) .................... 0404749.4

(51) Int. Cl.
*H01L 21/337* (2006.01)
(52) U.S. Cl. .............. 438/192; 438/197; 438/206; 438/212; 257/220; 257/262; 257/E21.693; 257/E51.006
(58) Field of Classification Search .............. 438/173, 438/192, 197, 206, 207, 212; 257/330, 220, 257/262, 350
See application file for complete search history.

(56) References Cited

U.S. PATENT DOCUMENTS 6,160,288 A    12/2000   Yamada et al.
7,033,876 B2 *  4/2006   Darwish et al. ............. 438/212

FOREIGN PATENT DOCUMENTS

| EP | 1041640 | 10/2000 |
|---|---|---|
| JP | 02 086171 | 3/1990 |
| WO | WO 98/04004 | 1/1998 |

* cited by examiner

Primary Examiner—Hsien-ming Lee

(57) ABSTRACT

A method of manufacturing an insulated gate field effect transistor includes providing a substrate (2) having a low-doped region (4), forming insulated gate trenches (8) and implanting dopants of a first conductivity type at the base of the trenches (8). A body implant is implanted in the low-doped regions between the trenches; and diffused to form an insulated gate transistor structure in which the body implant diffuses to form a p-n junction between a body region (22) doped to have the second conductivity type above a drain region (20) doped to have the first conductivity type, the p-n junction being deeper below the first major surface between the trenches than at the trenches. The difference in doping concentration between the low-doped region (4) and the implanted region at the base of the trenches causes the difference in depth of the body-drain p-n junction formed in the diffusion step.

10 Claims, 5 Drawing Sheets

TRENCH FIELD EFFECT TRANSISTOR AND METHOD OF MAKING IT

The invention relates to a trench field effect transistor (FET) and to a method of making it.

Trench MOSFETs are commonly used, for example in voltage regulator modules (VRMs) in power supplies for electronic equipment such as personal computers. Commonly, a pair of MOSFETs are used, known as a Control FET and a Sync FET. The ideal characteristics of these FETs differ slightly. For the Sync FET the conduction power loss should be as low as possible. Since the conduction power loss is proportional to the specific on-resistance ($R_{ds,on}$), i.e. the on-resistance for unit area of substrate, this parameter should be reduced. For the Control FET on the other hand the switching loss should be minimised, which is proportional to the gate-drain charge density ($Q_{gd}$), i.e. the gate-drain charge per unit area of substrate.

A figure of merit (FOM) has been defined as the multiple of $R_{ds,on}$ and $Q_{gd}$ to provide an indication of how suitable a transistor is in for use in VRMs. Note that the smaller the FOM the better. There is a need for structures that provide an improved figure of merit.

One way of improving the figure of merit is to achieve a low on-state resistance by increasing the channel width for a fixed area of silicon by decreasing the cell pitch. This however increases the total length, viewed from the upper surface, of the gate-channel boundary and hence increases the total exposed area between gate and drain for unit surface area.

However, this reduction in cell pitch is not necessarily attractive for the Control FET since in a conventional structure the gate drain charge density $Q_{gd}$ increases drastically with reduced size. Thus, simply reducing the size of the structure does not give improvements as large as might be expected.

Another way of increasing the figure of merit is by choice of geometry. A stripe geometry as compared to a hexagonal cell geometry has less gate-drain periphery for unit area, and corresponding lower gate-drain capacitance and switching losses. Although the improvement in switching loss is gained at the expense of on-state resistance the figure of merit is in general, though not always, better using stripes than a hexagonal geometry.

A further method is to reduce the gate-drain periphery by etching a narrower trench. The gate-drain capacitance for a cell is determined by the width of the cell plus the length of the two trench sidewalls measured from the body-drain junction to the bottom of the trench. This means that reducing the trench width will reduce the overall gate-drain capacitance. A further possibility is to reduce the trench depth though this is technically difficult.

Another approach is to implant an arsenic donor region below the base of the trench to create a heavily doped enhanced conductivity drain region under the trench gate. An example of this approach is described in EP-A-1041640. The heavily doped drain region allows the body-drain junction to be below the base of the trench, which eliminates the gate-drain capacitance contribution from the trench sidewalls, reducing the overall gate-drain capacitance. Secondly, the deeper body-drain junction results in a reduced depletion capacitance and again a reduced gate-drain capacitance.

However, this arsenic doped structure also has downsides. The heavily doped drain region reduces the breakdown voltage. Further, when the device is turned on, the geometry of the structure can cause severe pinching of the on-state current, leading to a significant increase in the resistance of the transistor in the on state.

There thus remains a need for an alternative method of reducing the gate-drain charge which avoids these disadvantages.

According to the invention there is provided a method of manufacturing an insulated gate field effect transistor; including:

providing a substrate having a first major surface having a low-doped region at the first major surface, the low-doped region having a concentration of less than $5 \times 10^{14}$ cm$^{-3}$ at the first major surface;

forming gate trenches extending from the first major surface;

forming trench insulator on the base and sidewalls of the gate trenches;

implanting dopants of a first conductivity type at the base of the trenches;

implanting a body implant of second conductivity type opposite to the first conductivity type in the low-doped regions between the trenches;

carrying out a diffusion step to form an insulated gate transistor structure in which the substrate dopants and body implant diffuses towards the substrate in the low doped region to form a p-n junction between a body region doped to have the second conductivity type above a drain region doped to have the first conductivity type, the p-n junction being deeper below the first major surface between the trenches than at the trenches; and forming source regions at the first major surface adjacent to the trench.

By using a very low doping in the low doped region and a slightly higher doping under the trench the body-drain boundary is shaped so that the effective boundary after diffusion of the body implant is lower away from the trenches.

The very low doping density used in the low doped region is much less than that normally used to make an insulated gate trench FET of the required breakdown voltage. For example, a conventional process for making a 25V breakdown trench FET may start with a $2.77 \times 10^{16}$ cm$^{-3}$ doping density in the epilayer, and then form the trenches in the epilayer before implanting a body implant.

In contrast, the process according to the invention for making a trench FET having a 25V breakdown voltage may use a $5 \times 10^{14}$ cm$^{-3}$ doping concentration in an epilayer, or even less. The exact doping used will depend on the properties of the finished device.

The idea in the present invention is to ensure that the body-drain boundary ends up deeper into the substrate away from the trench than at the trench, by using a lower doping in the epilayer away from the trench than in the additionally doped region. This allows a moderate doping to be used for the additionally doped region without all of the disadvantages of excessive doping concentration under the trenches.

The prior art makes no attempt to target particular doping densities in the epilayer before implantation, unsurprisingly perhaps since a low doping density in this layer does not result in any particular doping density in the finished structure, the doping density in the epilayer in the finished structure being determined essentially by the body implant. The inventors have realised that although the doping in the epilayer does not end up as the doping concentration in any layer in the finished structure, by ensuring a doping concentration at the base of the trench that is essentially correct for a particular breakdown voltage and an even lower doping elsewhere, the form of the body-drain boundary can be arranged to be deeper away from the trench than at the trench thereby reducing gate-drain capacitance.

By keeping a suitable, low, doping concentration in the drain under the trench, chosen to be suitable for a particular breakdown voltage, the trench FET does not suffer from the deterioration in breakdown voltage experienced in the prior art structures in which the additional doping under the trench causes deterioration in performance.

A similar structure to that proposed in the present invention is proposed, albeit for different reasons, in WO-A-98/04004, which is similar in particular in providing a doped implant below the trench. However, in WO-A-98/04004 a deep p+ implant spaced away from the trench is performed in addition to a body implant to arrange for a deeper drain-body boundary away from the trench than adjacent to the trench. In contrast, the invention does not require such an additional step since it achieves the deeper drain-body boundary simply by the use of a low doped epilayer. As the skilled person will appreciate, additional steps such as those proposed in WO-A-98/04004 are to be avoided.

By ensuring that the boundary between body conductivity type doping and drain conductivity type doping is deeper into the substrate between the trenches than at (i.e. adjacent to) the trenches the gate-drain charge, which flows perpendicularly to this boundary, is directed away from the gate.

The structure formed in the diffusion step preferably has an additionally doped region of first conductivity type at the base of the gate trenches having a doping density below $5 \times 10^{16}$ cm$^{-3}$ but higher than in the drain regions between the trenches.

In contrast, in the prior art approach of EP-A-1041640, there is no attempt made to keep the doping in the implanted region under the trenches down. Accordingly, the level of doping here will have adverse effects on the breakdown voltage.

Preferably, the p-n junction boundary between drain and body is deeper than the trenches between the trenches. In this way, the contribution to the gate-drain capacitance from the trench sidewalls is essentially eliminated.

In preferred embodiments for making an insulating gate transistor of predetermined breakdown voltage, the doping of the low doped region at the first major surface is at most one half of a predetermined doping concentration. The predetermined doping concentration is the doping of an epilayer for forming a conventional insulated gate field effect transistor without the step of implanting dopant at the gate of the trench.

Preferably, the doping in the body implant is kept low to avoid swamping the small difference in the doping levels below the trench and in the low-doped regions. Accordingly, the dose of the body implant may be preferably at most $5 \times 10^{13}$ cm$^{-2}$, preferably at most $2.5 \times 10^{13}$ cm$^{-2}$.

An implantation step is preferably used to implant dopants of first conductivity type in an epilayer formed on the substrate to form a low-doped epilayer and in particular the low-doped region.

In embodiments, the method includes forming a pattern laterally across the first major surface of the substrate, the pattern doped to have lower-doped regions of first conductivity type alternating with higher-doped regions of first conductivity type. The gate trenches are then formed in the higher-doped regions. In this way, a 25 V breakdown trench FET may be formed in islands of higher-doped semiconductor, doped to have a suitable doping concentration for 25V breakdown, whereas the lower doped regions can be doped to have a lower concentration.

The step of forming a pattern may include:

depositing an epilayer of semiconductor doped to have a lower doping density;

patterning a plurality of trench etch windows spaced laterally across the substrate; and implanting dopants though the trench etch windows, the dopants being of a first conductivity type; and wherein the step of forming gate trenches in the higher doped regions includes etching gate trenches through the trench etch windows.

The step of forming a pattern laterally across the first major surface of the substrate may alternatively be carried out by etching a plurality of semiconductor trenches spaced laterally across the substrate in a layer of lower doping density; and growing semiconductor doped to have a higher doping density in the semiconductor trenches.

In preferred embodiments, the semiconductor is silicon and the first conductivity type is n-type.

The higher doping density of the higher-doped regions of first conductivity type in the pattern may be above $1 \times 10^{16}$ cm$^{-3}$ and below $3 \times 10^{16}$ cm$^{-3}$ at the first major surface.

For a better understanding of the invention, embodiments will be described with reference to the accompanying drawings in which.

Note that the Figures are schematic and not to scale and that like or similar components are shown with the same reference numeral in different Figures.

Figure 1:
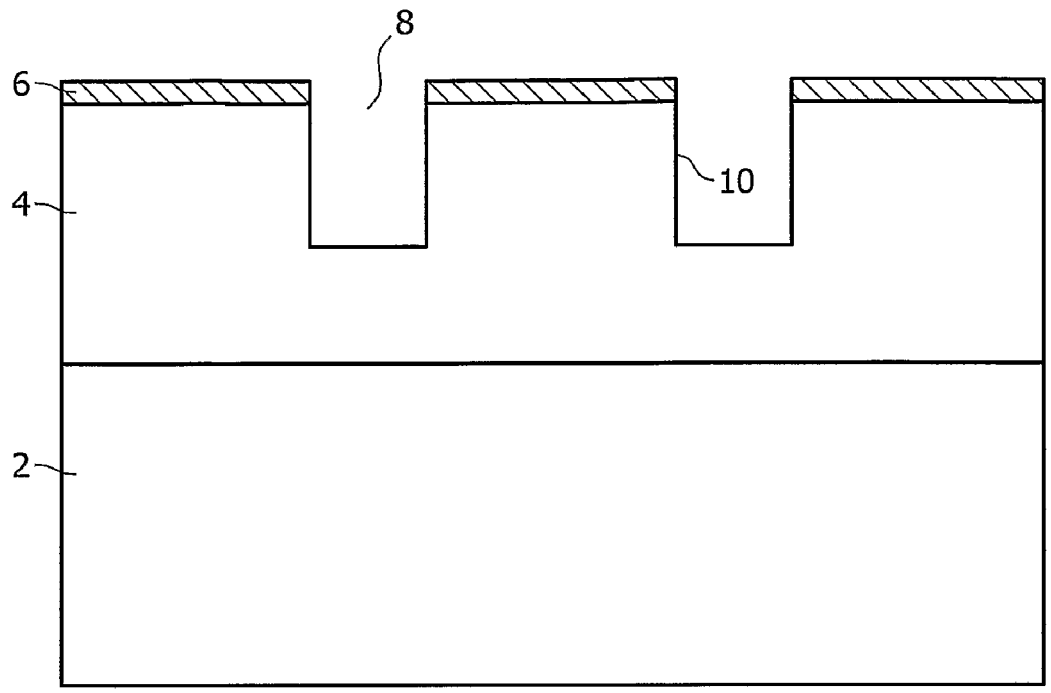
FIG. 1 illustrates a first step in a process according to a first embodiment of the invention.

Referring to FIG. 1, a 3.5 microns thick epilayer 4 is formed on the first major surface of an n+ ($10^{19}$ cm$^{-3}$) doped silicon substrate 2. The epilayer is doped n type with a doping concentration of $5 \times 10^{10}$ cm$^{-2}$ corresponding to $1.2 \times 10^{14}$ cm$^{-3}$. In alternative embodiments the epilayer is undoped.

A mask 6 is formed having trench windows 8 formed in stripes laterally across the substrate with a pitch of 2.5 microns.

Next, a DP implant step is carried out to form a p+ type implant that acts as a guard ring in the edge termination in the finished device.

A trench etch step is carried out forming trenches 10, resulting in the structure shown in FIG. 1.

Next, a standard rounding process is carried out to round the bottom of the trench.

An arsenic implant is then carried out into the base of the trench 10, through the windows 8 in mask 6 which is still in place. The implant is $5 \times 10^{12}$ cm$^{-2}$ and is carried out at 120 keV.

Gate oxide 12 is then formed and a LOCOS process is then used to form a thick oxide layer 14 at the bottom of the trench having a thickness of 100 nm. The mask 6 is removed. The trench insulator in this embodiment accordingly has thin gate oxide 12 on the sidewalls and thick oxide 14 on the base of the trench.

A single body implant of $1.8 \times 10^{13}$ cm$^{-2}$ at 180 keV is then carried out, and an anneal of 40 minutes at 1100° C. carried out. This anneal diffuses the body implant, as well as the arsenic implant.

The structure is then finished by deposition of a polysilicon gate 16 in the insulated trench, and implantation of a source region 18, as in a conventional trench-FET. The source implant may be for example $5 \times 10^{15}$ cm$^{-2}$ at 120 keV.

In the example, a blanket source implant is carried out, i.e. a source implant over the whole structure, although this is not essential to the invention. However, since it is necessary to contact the body, a moat etch is required.

A moat etch is then carried out to etch the semiconductor away from the trench to below the depth of the source 18, in the example to a depth of 0.5 μm. A contact implant is then carried out in the body to provide a good contact to the body. Source contact 28 and drain contact 30 are formed on the first and second major surfaces respectively. Source contact 28 contacts both source region 18 and body region 22.

Figure 2:
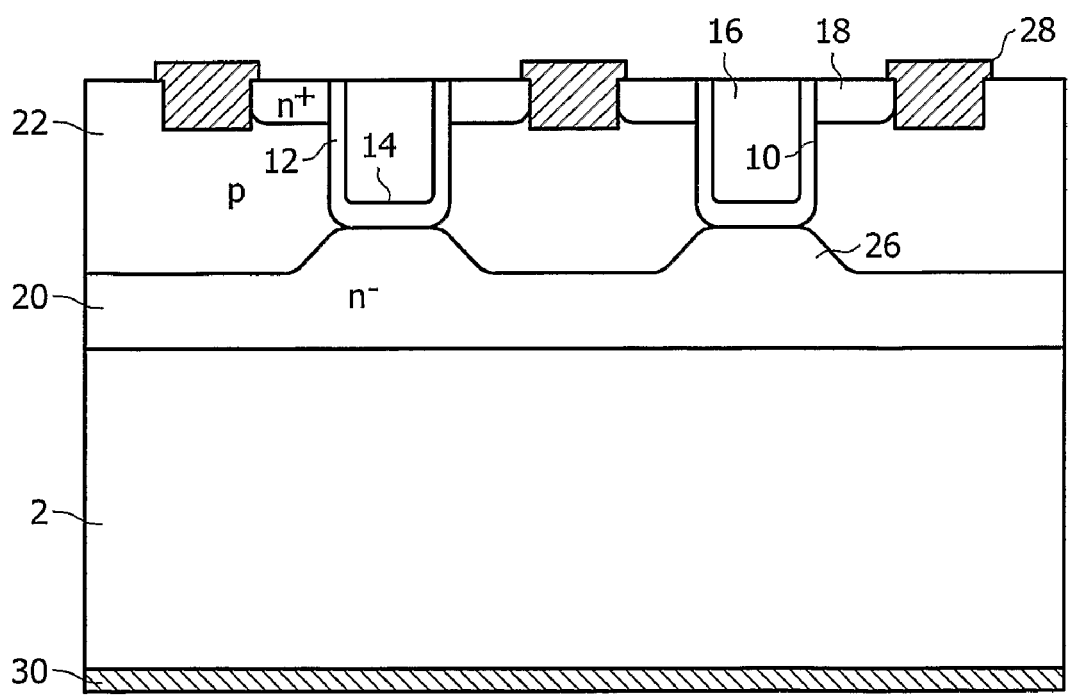
FIG. 2 illustrates the trench FET according to the first embodiment.

FIG. 2 shows the finished result in which drain region 20 extends from the substrate, source region 18 is provided adjacent to the trench 10 at the first major surface and body region 22 extends between the source region 18 and the drain region 20. Note that the boundary between body region 22 and drain region 20 is deeper away from the trench owing to additionally doped region 26 beneath the trench doped by the arsenic implant carried out into the trench.

The trench is insulated by thin gate oxide 12 on the sidewalls of the trench 10 and thick oxide 14 at the base.

A source contact 28 connects to source 18 and body 22 regions and a drain contact connects to drain region 20. In the embodiment this is shown as a back contact but the skilled person will be aware of the possibility of forming a drain contact on the first major surface laterally spaced from the trenches, source and body and this alternative may be adopted if required.

Figure 3:
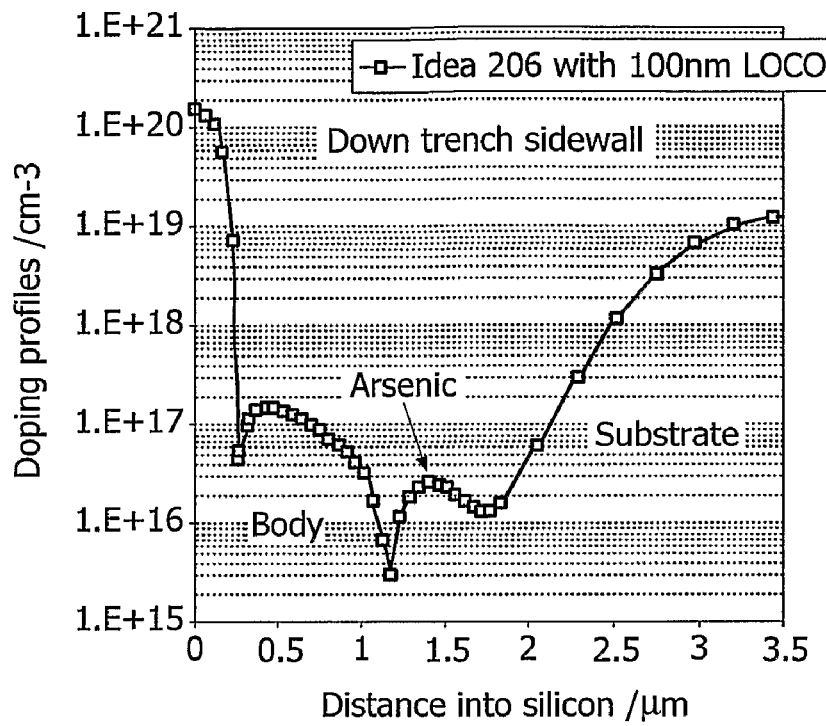
FIG. 3 shows a simulated doping profile for the first embodiment.

FIG. 3 shows a simulated doping profile measured vertically from the first major surface. Note that source region 18, body region 22, doped region 26 and drain region 20 are all apparent in the profile.

Figure 4:
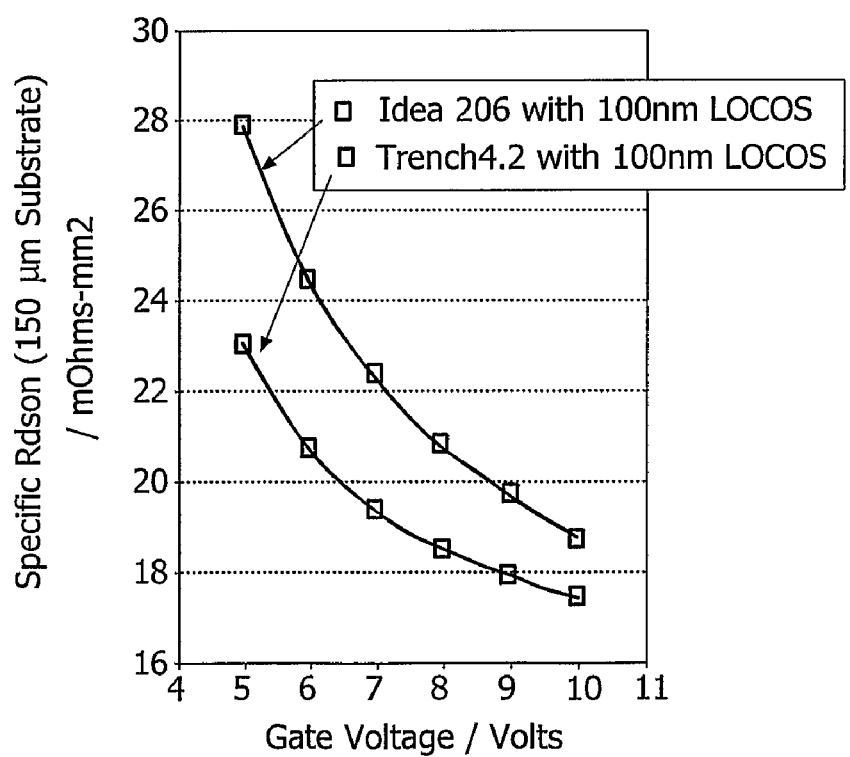
FIG. 4 shows simulated specific Rdson values for the first embodiment and for a comparative example.
Figure 5:
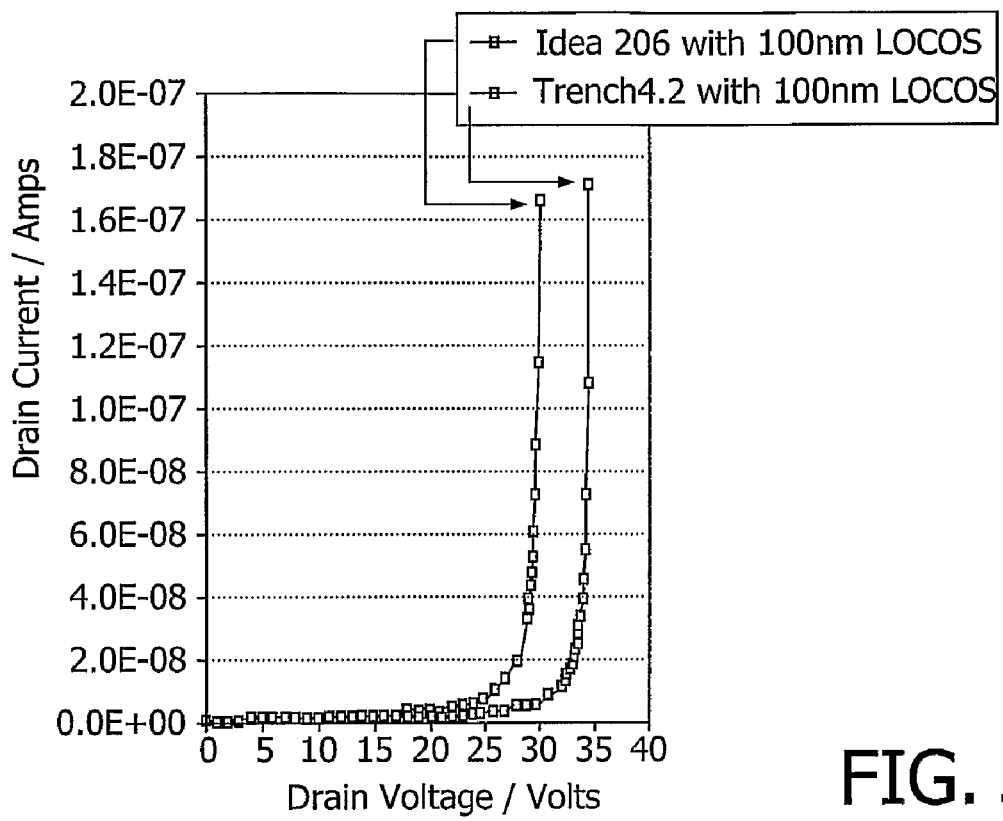
FIG. 5 shows drain current for the first embodiment and for a comparative example.

FIG. 4 shows simulated specific Rdson (i.e. on-resistance for unit area) values for the first embodiment of the invention (upper curve) and a comparative example without the arsenic implant (lower curve). The value for the invention is very slightly worse at a typical gate voltage of 10V. FIG. 5 shows drain current for the comparative example (left curve) and the first embodiment (right curve).

Note that the breakdown voltage has increased using the invention compared to prior art arrangements. The skilled person will realise that by increasing the doping density of arsenic a like breakdown voltage could be achieved using the invention to that in the comparative example, and this would provide a further improved specific on-resistance value.

Figure 6:
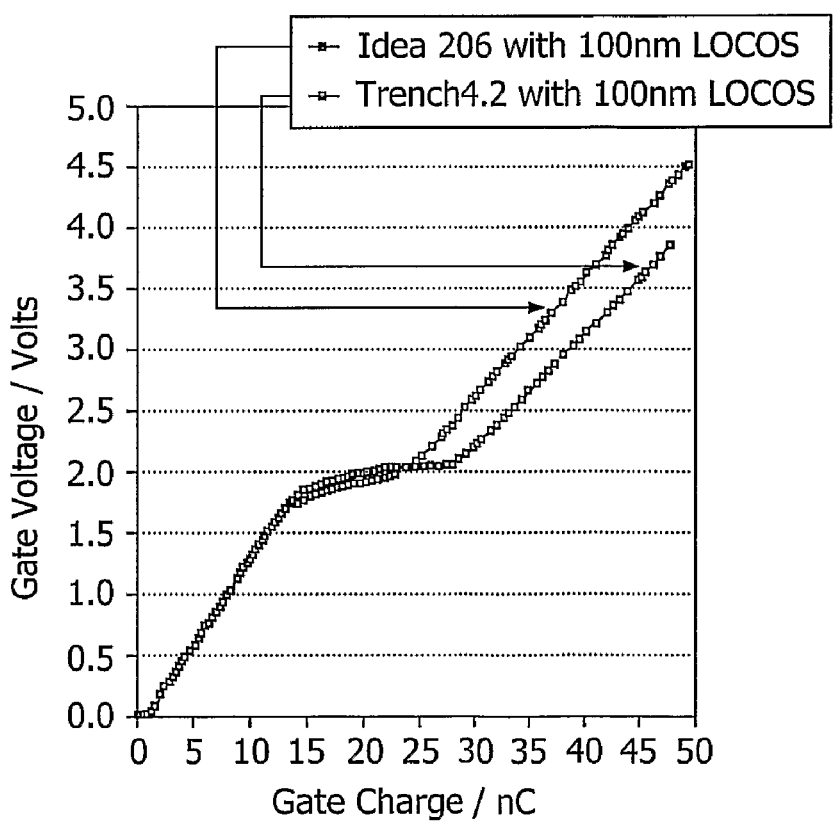
FIG. 6 shows the gate voltage as a function of gate charge for the first embodiment and for a comparative example.
Figure 7:
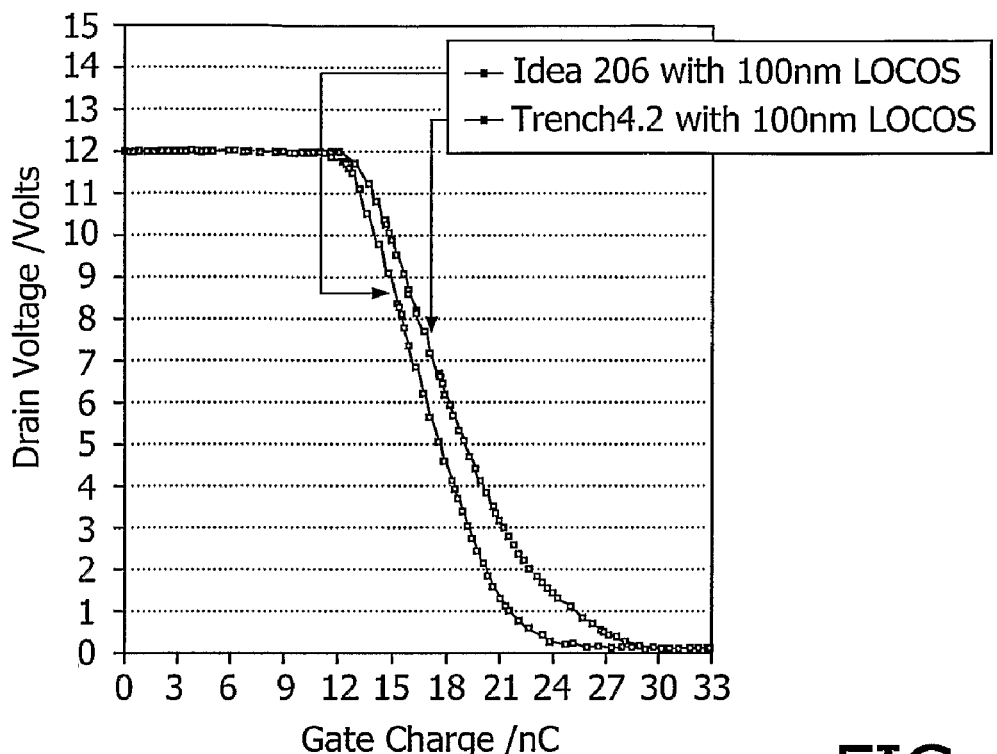
FIG. 7 shows the drain voltage as a function of gate charge for the first embodiment and for a comparative example.

FIGS. 6 and 7 show the gate voltage and drain voltage respectively as a function of gate charge. In FIG. 6 the invention is the upper curve and the comparative example the lower curve and in FIG. 7 the invention is the left curve and the comparative example the right curve.

Note from FIG. 6 that the invention has a lower gate charge for given gate voltage than the comparative example.

FIG. 7 is perhaps even more important in that it demonstrates a faster switching of the transistor according to the invention than the comparative example.

This is understood by the inventors to be due to the way in which the dopant region 26 causes the depletion contours to be angled roughly along the body-drain boundary 24 shown in FIG. 2. This in turn causes capacitive current, which flows across these depletion contours, to be directed away from the gate and towards the body.

Figure 8:
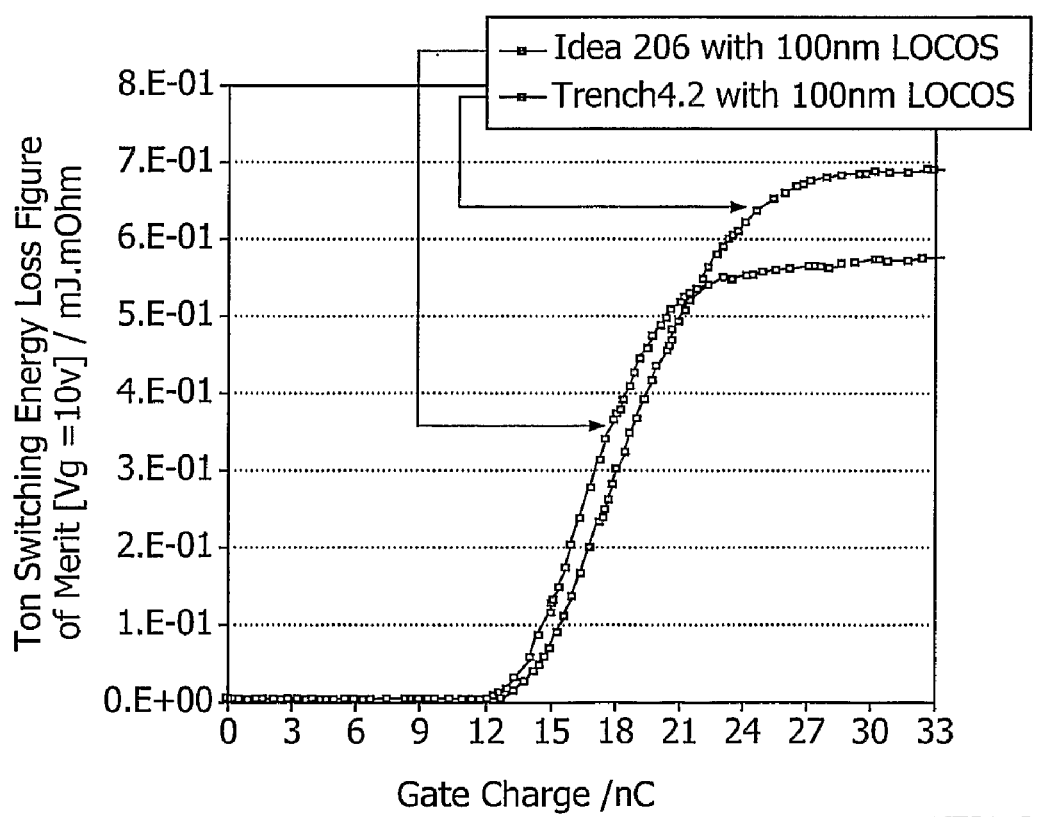
FIG. 8 shows the simulated switching energy loss for the first embodiment and for a comparative example.

FIG. 8 shows the simulated switching energy loss (figure of merit) of the first embodiment of the invention and the comparative example. Note that the invention gives a significantly better result, a 20% improvement.

Note that the first embodiment is not an optimised structure and it is to be expected that even better results could be achieved, for example by reducing the breakdown voltage which should lead to a reduced Rdson and hence a reduced figure of merit.

The simulations were carried out for a drain-source voltage of 12V but an even bigger improvement could be expected at a higher voltage, for example 19V.

Figure 9:
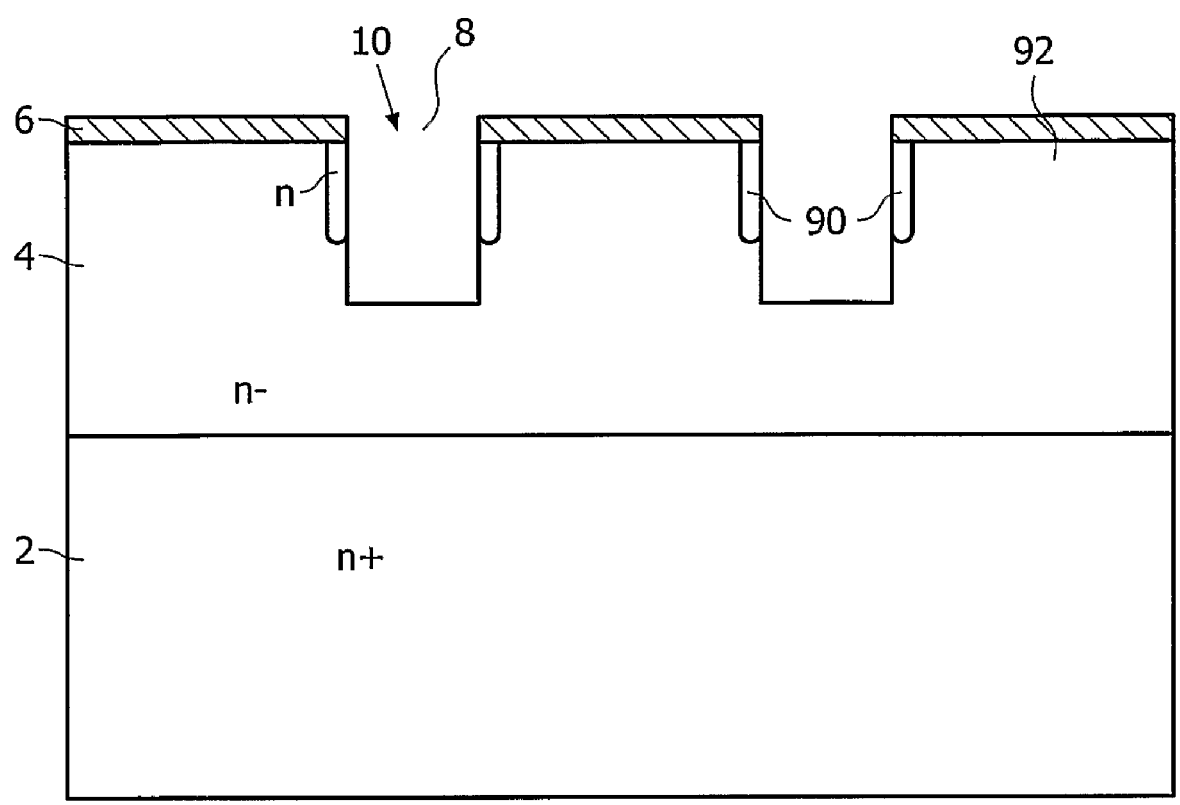
FIG. 9 shows a step in the manufacture of a second embodiment of the invention.

In a second embodiment of the invention, the substrate is first patterned to have a pattern across the surface before the trenches are formed. This may be done, for example, by simply implanting n-type dopant through the mask windows 8 before etching the trenches 10. This creates higher doped regions 90 between lower doped regions 92. The resulting pattern is illustrated in FIG. 9. Subsequent processing carries on as in the first embodiment.

The skilled person will appreciate that a number of modifications may be made to the embodiments without departing from the scope of the invention. In particular, the n- and p-type regions may be interchanged.

The invention is not just applicable to silicon as the semiconductor but may be applied in any suitable semiconductor including for example GaAs. Further, the device is of simple form and may be used not merely on a single crystal substrate but also as part of thin film transistors.

From reading the present disclosure, other variations and modifications will be apparent to persons skilled in the art. Such variations and modifications may involve equivalent and other features which are already known in the design, manufacture and use of semiconductor devices and which may be used in addition to or instead of features described herein. Although claims have been formulated in this application to particular combinations of features, it should be understood that the scope of disclosure also includes any novel feature or any novel combination of features disclosed herein either explicitly or implicitly or any generalisation thereof, whether or not it mitigates any or all of the same technical problems as does the present invention. The applicants hereby give notice that new claims may be formulated to any such features and/or combinations of such features during the prosecution of the present application or of any further applications derived therefrom.

The invention claimed is:

1. A method of manufacturing an insulated gate field effect transistor, the method comprising:
   providing a substrate having a first major surface having a low-doped region at the first major surface, the low-doped region having a concentration of less than $5 \times 10^{14}$ cm$^{-3}$ at the first major surface;
   forming gate trenches extending from the first major surface;
   forming trench insulator on a base and sidewalls of the gate trenches;
   implanting dopants of a first conductivity type at the base of the trenches;
   implanting a body implant of second conductivity type opposite to the first conductivity type in the low-doped regions between the gate trenches;
   carrying out a diffusion step to form an insulated gate field effect transistor structure in which the body implant diffuses towards the substrate in the low-doped region to form a p-n junction above a drain region and between a body region and the drain region, wherein the body region is doped to have the second conductivity type and the drain region is doped to have the first conductivity type, the p-n junction being deeper below the first major surface between the trenches than at the gate trenches; and forming source regions at the first major surface adjacent to the gate trenches.

2. A method according to claim 1 in which a boundary of the p-n junction between drain and body regions is deeper between the gate trenches than the depth of the trenches.

3. A method according claim 1 in which the insulated gate field effect transistor structure formed in the diffusion step has an additionally doped region of first conductivity type at the base of the gate trenches having a doping density below $5 \times 10^{16}$ cm$^{-3}$ but higher than in the drain region between the gate trenches.

4. A method according claim 1, wherein implanting the body implant comprises implanting the body implant with a dose of at most $5 \times 10^{13}$ cm$^{-2}$.

5. A method according to claim 1 further comprising:
forming a pattern laterally across the first major surface of the substrate, the pattern doped to have lower-doped regions of first conductivity type alternating with higher-doped regions of first conductivity type, wherein the lower-doped regions have a concentration of less than about $5 \times 10^{14}$ cm$^{-3}$ and, the higher-doped regions have a concentration between about $1 \times 10^{16}$ cm$^{-3}$ and $3 \times 10^{16}$ cm$^{-3}$;
wherein the gate trenches are formed in the higher-doped regions.

6. A method according to claim 5 wherein forming the pattern laterally across the first major surface of the substrate comprises:
depositing an epilayer of semiconductor doped to have a doping density lower than a doping density of the gate trenches;
patterning a plurality of trench windows spaced laterally across the substrate; and
implanting dopants though the trench windows, the dopants being of a first conductivity type;
wherein forming the gate trenches in the higher-doped regions comprises etching gate trenches through the trench windows.

7. A method according to claim 5 wherein forming the pattern laterally across the first major surface of the substrate comprises:
etching a plurality of semiconductor trenches spaced laterally across the substrate in a layer of doping density lower than a doping density of the semiconductor trenches; and
growing semiconductor doped to have a doping density in the semiconductor trenches higher than the doping density of the substrate.

8. A method according to claim 7, wherein the semiconductor is silicon and the first conductivity type is n-type.

9. A method according to claim 1, for making an insulating gate field effect transistor of predetermined breakdown voltage for which the doping of an epilayer for forming an insulated gate field effect transistor without the step of implanting dopant at a gate of the gate trench has a first predetermined doping concentration;
wherein the doping of the low-doped region at the first major surface is at most one half of the first predetermined doping concentration.

10. A method according to claim 1, further comprising performing a moat etch by etching the first major surface to form the gate trenches to a depth below the bottom of the source region.

* * * * *